(12) United States Patent
Peterson et al.

(10) Patent No.: US 7,379,297 B2
(45) Date of Patent: May 27, 2008

(54) AIR FLOW REGULATION DEVICES

(75) Inventors: Eric C. Peterson, Richardson, TX (US); Christian L. Belady, Richardson, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 31 days.

(21) Appl. No.: 11/586,300

(22) Filed: Oct. 25, 2006

(65) Prior Publication Data

US 2008/0101015 A1    May 1, 2008

(51) Int. Cl.
*H05K 7/20* (2006.01)

(52) U.S. Cl. .................. 361/690; 361/694; 361/695; 439/135; 439/485; 454/184

(58) Field of Classification Search ............. 361/687, 361/690, 694–695; 439/135, 485–487; 454/184
See application file for complete search history.

(56) References Cited

U.S. PATENT DOCUMENTS

| 5,034,853 | A | 7/1991 | Mazura et al. | 361/725 |
|---|---|---|---|---|
| 6,118,667 | A | 9/2000 | Grosser et al. | 361/752 |
| 6,130,820 | A | 10/2000 | Konstad et al. | 361/695 |
| 6,193,529 | B1 | 2/2001 | Kimura | 439/149 |
| 6,755,672 | B2 | 6/2004 | Lai et al. | 439/135 |
| 6,971,884 | B2 | 12/2005 | Zhao et al. | 439/62 |
| 7,061,760 | B2 | 6/2006 | Hornung et al. | 361/695 |
| 7,092,252 | B2 | 8/2006 | Robertson | 361/690 |
| 7,106,595 | B2 | 9/2006 | Foster et al. | 361/721 |
| 2004/0005808 | A1 | 1/2004 | Walkup et al. | 439/485 |

*Primary Examiner*—Gregory D Thompson

(57) ABSTRACT

In one embodiment, an airflow regulation device comprises a at least one base member configured to couple to a connector on a circuit board, a first segment connected to the at least one base member and extending a first height from the at least one base member, and a second segment removably connected to the first segment and extending a second height from the at least one base member, wherein the second height is different than the first height.

18 Claims, 6 Drawing Sheets

AIR FLOW REGULATION DEVICES

BACKGROUND

Some electronic devices such as, e.g., computing systems, utilize airflow cooling systems to dissipate heat generated by components such as, e.g., integrated circuits. Such systems may be designed to direct airflow across components in a particular manner to provide effective cooling to components of the electronic device. For example, some computing systems utilize direct in-line memory modules (DIMMs) as airflow impedance devices to direct airflow across a motherboard. Removing at least one DIMM or using short DIMMs can alter the airflow characteristics, thereby reducing the effectiveness of the cooling system.

DETAILED DESCRIPTION

Described herein are embodiments of airflow regulation devices, and circuit boards and computer systems which may incorporate the airflow regulation devices. In the description herein numerous specific details are provided, such as examples of components and/or methods, to provide a thorough understanding of the airflow regulation devices. One skilled in the relevant art will recognize, however, that embodiment(s) can be practiced without at least one of the specific details, or with other apparatus, systems, methods, components, materials, parts, and/or the like. In other instances, well-known structures, materials, or operations are not shown or described in detail to avoid obscuring aspects of embodiments.

In some embodiments, an airflow regulation device is adapted to couple to a connector on at least one circuit board. For example in some embodiments an airflow regulation device is embodied to emulate a memory module such as a dual in-line memory module (DIMM). When connected to a circuit board such as, e.g., the motherboard of a computer, the airflow regulation device may provide a structure to impede airflow in a similar manner as a DIMM device.

Figure 1A:
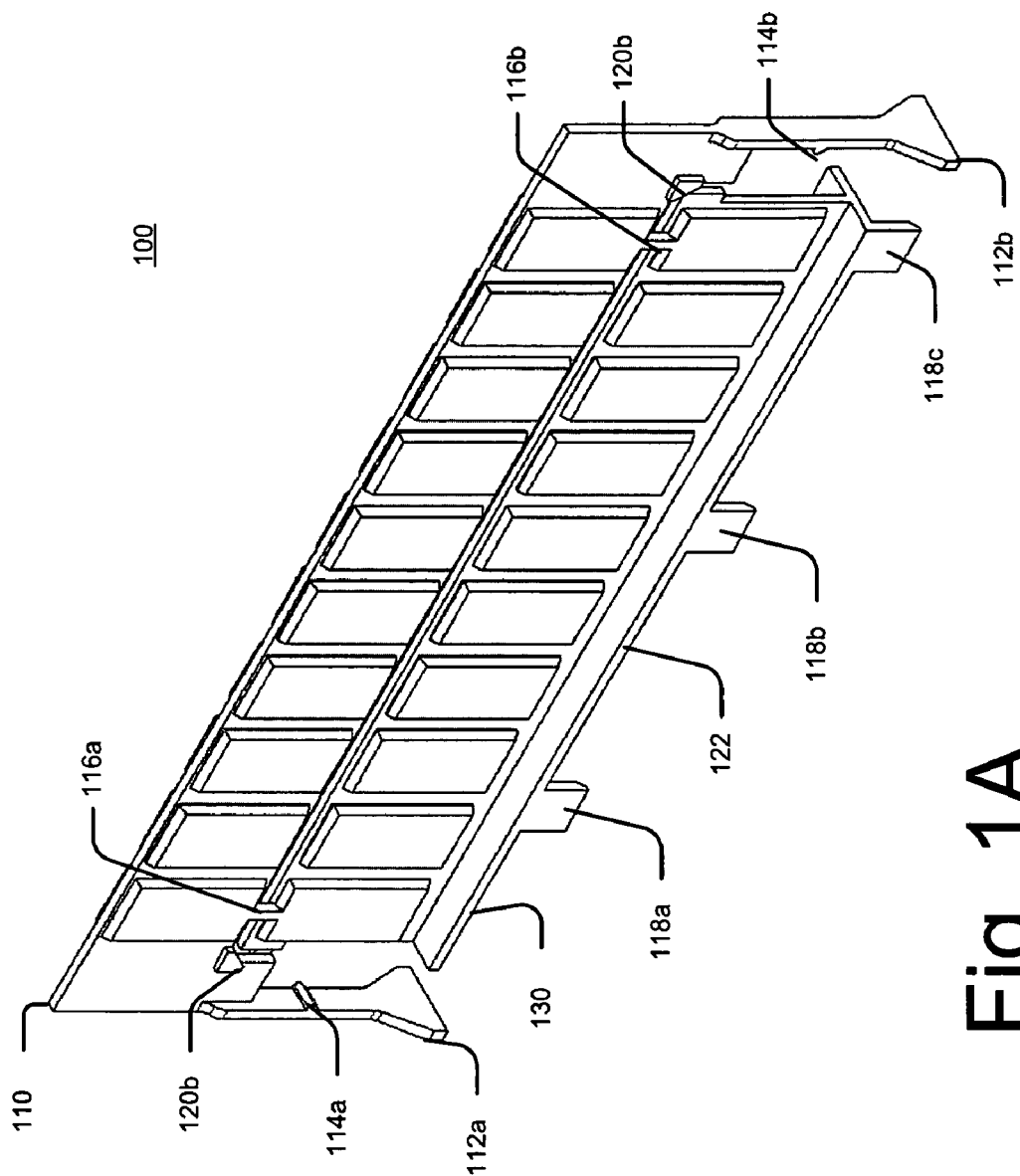
FIGS. 1A and 1B are perspective views of airflow regulation devices, according to embodiments.

FIG. 1A is a perspective view of an airflow regulation device 100, according to an embodiment. Referring to FIG. 1A, airflow regulation device 100 comprises a first segment 110 and a second segment 130 removably connected to the first segment 110 by at least one breakable tabs 116a, 116b. In the embodiment depicted in FIG. 1A two breakable tabs 116a, 116b connect the first segment 110 to the second segment 130. In alternate embodiments more or fewer connectors is used.

A first leg 112a and a second leg 112b are connected to first segment 110. First leg 112a and second leg 112b are configured to mate with a connector on a substrate such as, e.g., a circuit board. First leg 112a and second leg 112b comprise braces 114a, 114b, respectively, which cooperate with retention clips a circuit board. First segment 110 may further comprise at least one gusset 120a, 120b to stabilize the segment 110.

Second segment 130 further comprise at least one tab 118a, 118b, 118c adapted to connect to a memory socket on a circuit board. In the embodiment depicted in FIG. 1A second segment 130 comprises a base 122 and three tabs 118a, 118b, and 118c extending from base 122. In some embodiments more or fewer tabs are used in various locations. Also, in some embodiments legs 112a, 112b are omitted and the airflow regulation device 100 relies on tabs 118a, 118b, 118c to connect to the memory slot, or to connect directly to the circuit board.

First segment 110 extends a first height from the base of legs 112a and 112b. In some embodiments, the height of first segment 110 corresponds to a height of a dual in-line memory module (DIMM). Second segment 130 extends a second height from the base of legs 112a and 112b. In some embodiments, the height of second segment 112 corresponds approximately to the height of a small outline dual in-line memory module (SO-DIMM).

Figure 1B:
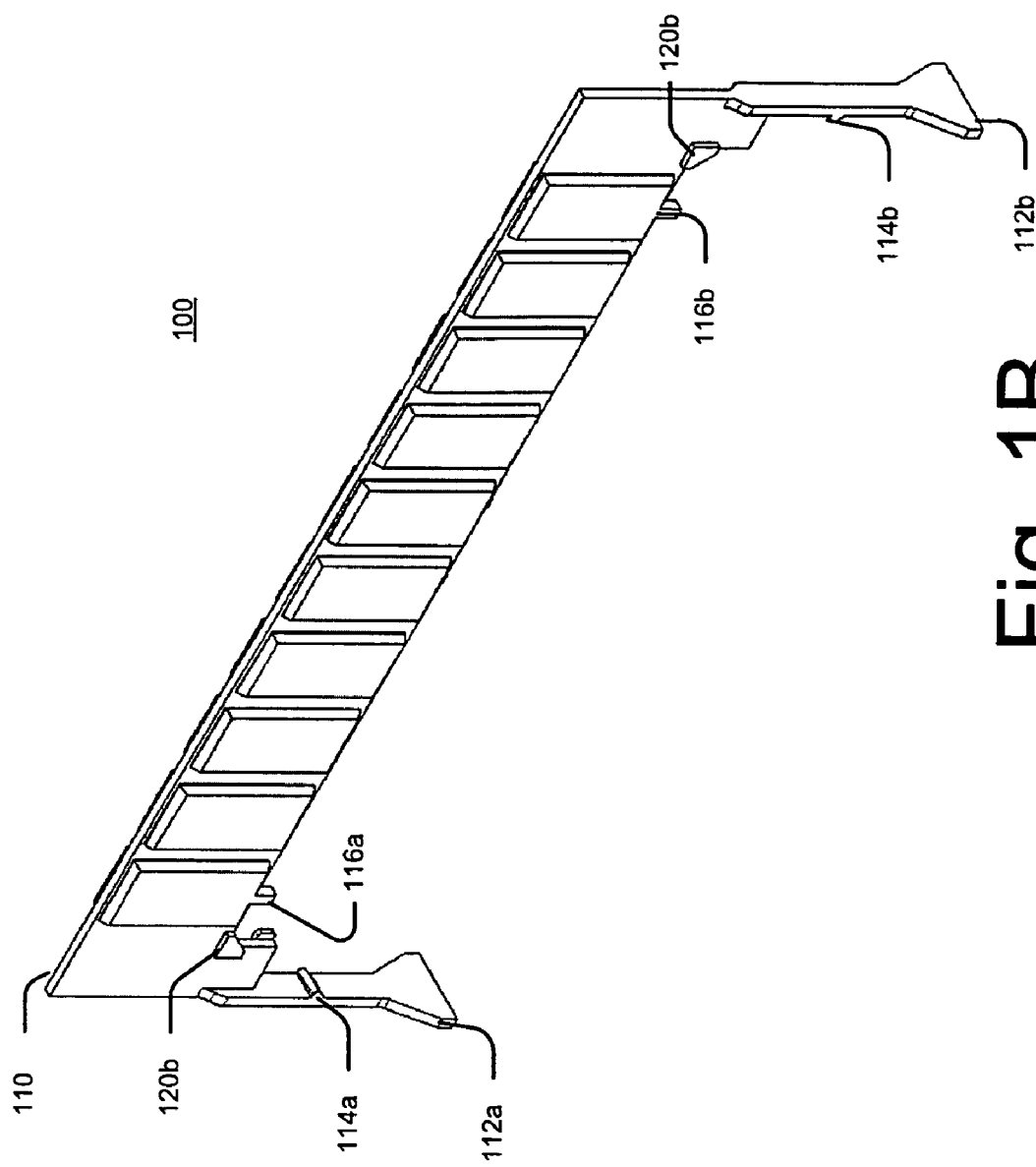

FIG. 1B is a perspective view of an airflow regulation device 100 after the second segment 130 has been removed e.g., by breaking tabs 116a, 116b. Removing second segment 130 permits first segment 110 to be installed above a SO-DIMM.

Figure 2:
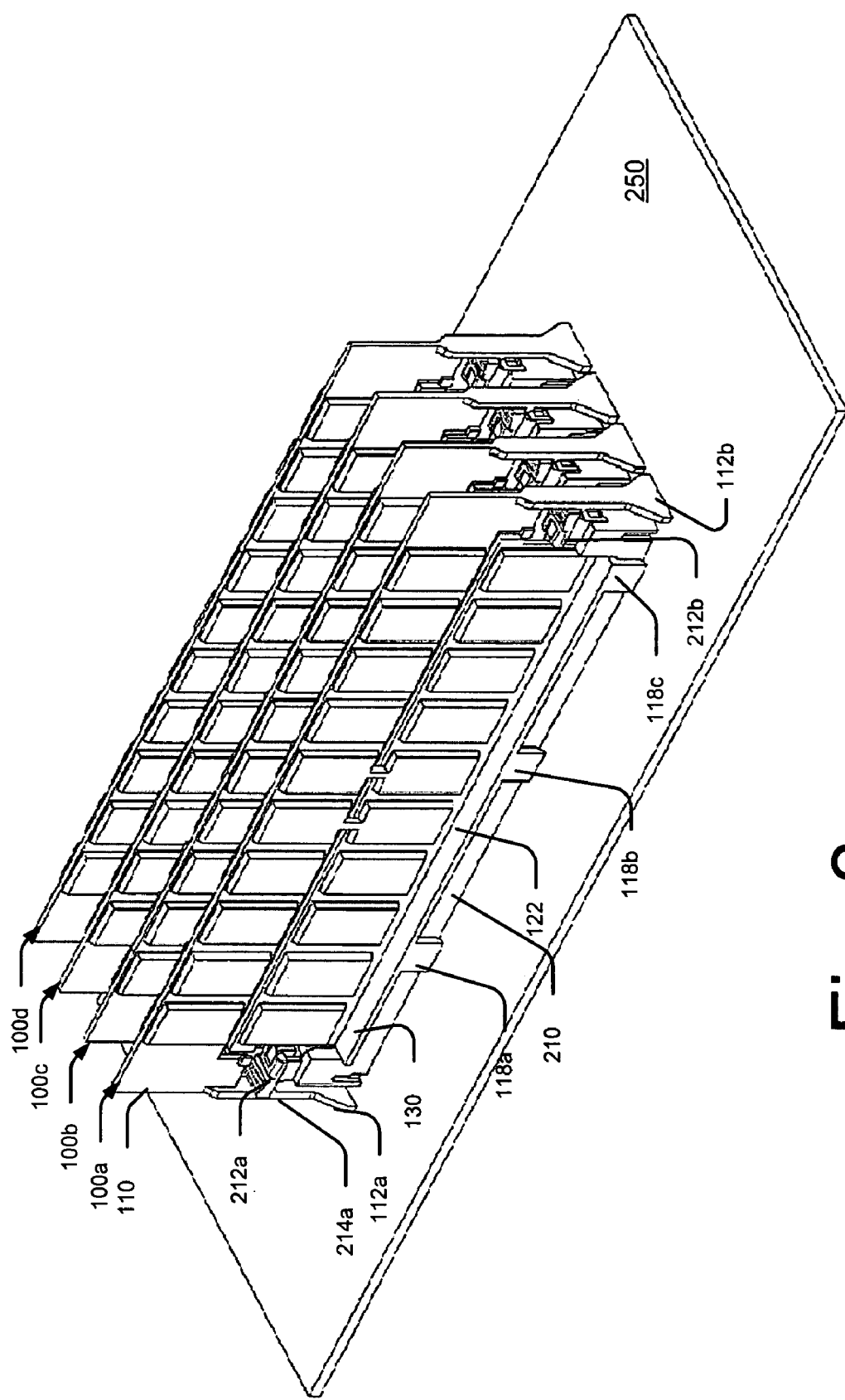
FIG. 2 is a perspective view of a plurality of airflow regulation devices connected to sockets, according to an embodiment.

In operation, airflow regulation device 100 is connected to a mating connector on a substrate such as, e.g., a circuit board, to regulate airflow over the circuit board. In some embodiments airflow regulation device 100 is used with both first segment 110 and second segment 130 intact. FIG. 2 is a perspective view of four airflow regulation devices 100a, 100b, 100c, 100d connected to sockets, according to such an embodiment.

Referring to FIG. 2, the sockets may be embodied as DIMM sockets 210. When the second segment 130 is intact the base 122 of second segment 130 fits on the upper surface of DIMM socket 210. Tabs 118a, 118b, 118c extend down the surface of DIMM socket 210 to help stabilize airflow regulation device 100 on DIMM socket 210. DIMM socket 210 is mounted to a suitable substrate such as, e.g., a circuit board 250.

DIMM socket 210 comprises a first bracket 212a that connects to first leg 112a and a second bracket 212b that connects to second leg 112b. In one embodiment, bracket 212a comprises a cross-bar 214a that mates with brace 114a when the bracket 212a is secured to first leg 112a of airflow regulation device 100. Similarly, bracket 212b comprises a cross-bar 214b that mates with brace 114b when the bracket 212b is secured to second leg 112b of airflow regulation device 100.

Figure 3:
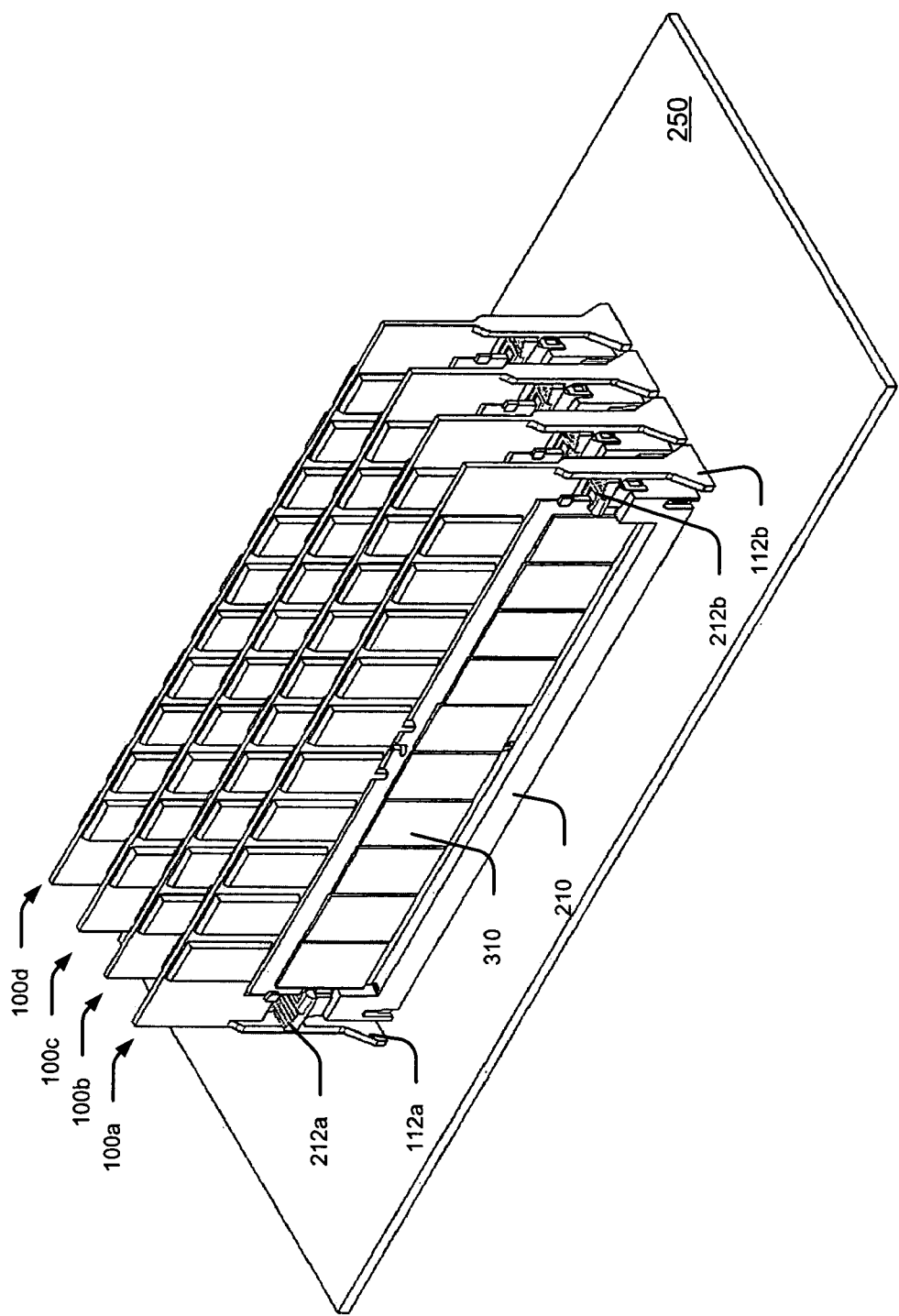
FIG. 3 is a perspective view of airflow regulation devices connected to sockets, according to an embodiment.

In some embodiments, second segment 130 is removed from first segment 110, e.g., by breaking tabs 116a, 116b. FIG. 3 is a perspective view of four airflow regulation devices 100a, 100b, 100c, 100d connected to sockets, according to such an embodiment.

Referring to FIG. 3, sockets are embodied as DIMM sockets 210 on a circuit board 250. When the second segment 130 is removed, airflow regulation device 100a is adapted to fit over a SO-DIMM 310.

As noted with reference to FIG. 2, DIMM socket 210 comprises a first bracket 212a that connects to first leg 112a and a second bracket 212b that connects to second leg 112b. In one embodiment, bracket 212a comprises a cross-bar 214a that mates with brace 114a when the bracket 212a is secured to first leg 112a of airflow regulation device 100.

Similarly, bracket 212b comprises a cross-bar 214b that mates with brace 114b when the bracket 212b is secured to second leg 112b of airflow regulation device 100.

Thus, at least one airflow regulation device 100 may be coupled to a socket such as, e.g., a DIMM socket to regulate air flow in the ambient environment surround a circuit board such as, e.g., a motherboard of a personal computer. Airflow regulation devices 100 may be used alone, as depicted in FIG. 2, or in conjunction with at least one memory module, as depicted in FIG. 3.

In alternate embodiments, an airflow regulation device 100 may be adapted to connect to a socket other than a memory socket or directly to the circuit board 250. For example, an airflow regulation device 100 may be adapted to connect to a socket for a processor or another chipset. Alternatively, a circuit board such as circuit board 250 may comprise connectors specifically adapted to retain an airflow regulation device.

Figure 4:
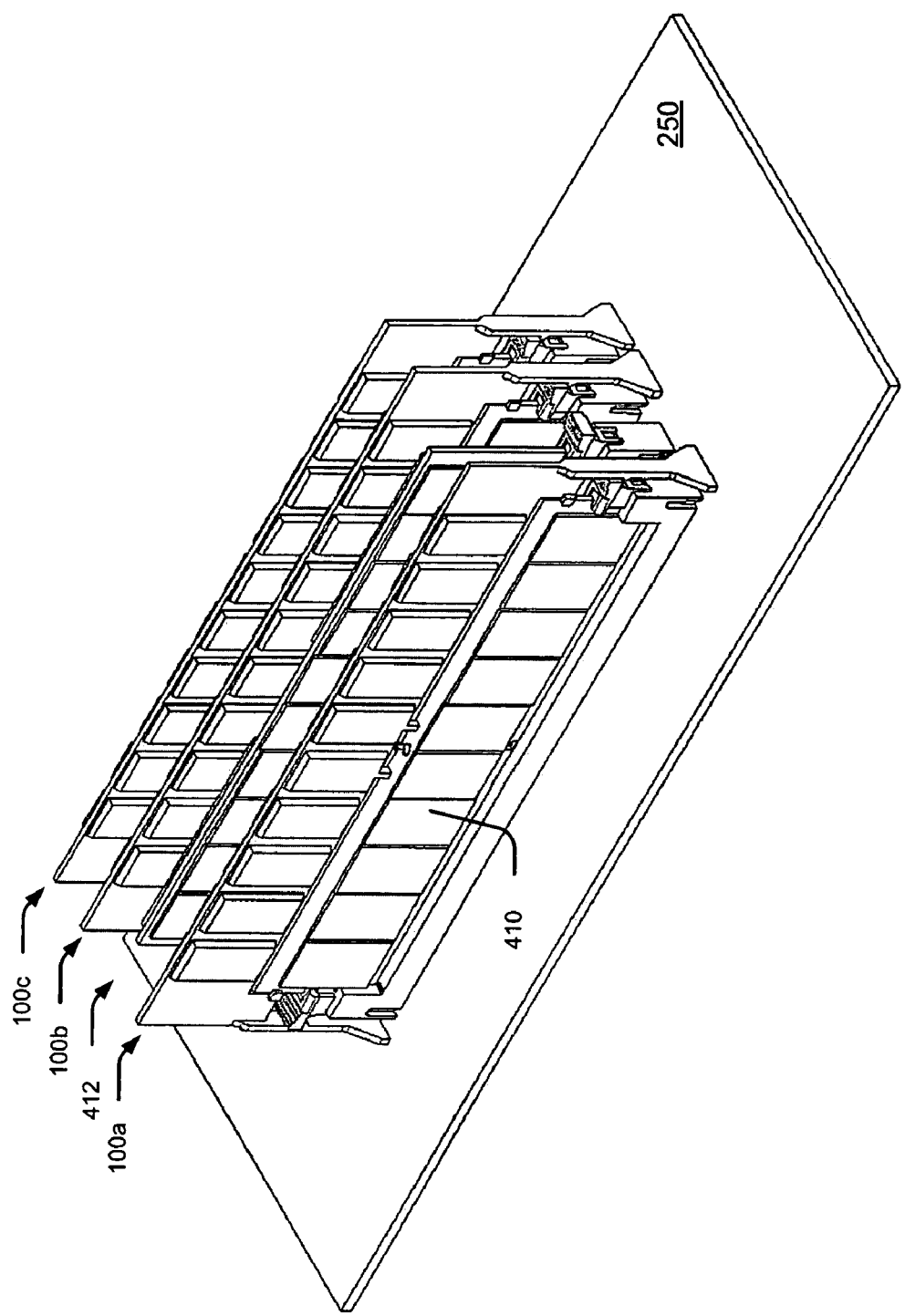
FIG. 4 is a perspective view of airflow regulation devices connected to sockets, according to an embodiment.

In some embodiments, airflow regulation devices may be used in combination with both full-size DIMMs and SO DIMMs. FIG. 4 is a perspective view of three airflow regulation devices 100a, 100b, 100c and a single full-size DIMM 412 connected to sockets, according to such an embodiment.

Referring to FIG. 4, sockets may be embodied as DIMM sockets 210 on a circuit board 250. The second segment 130 of the first airflow regulation device 100a has been removed such that airflow regulation device 100a is adapted to fit over a SO-DIMM 410. Full-size DIMM 412 provides substantially the same airflow impedance as the airflow regulation devices 100a, 100b, 100c.

Figure 5:
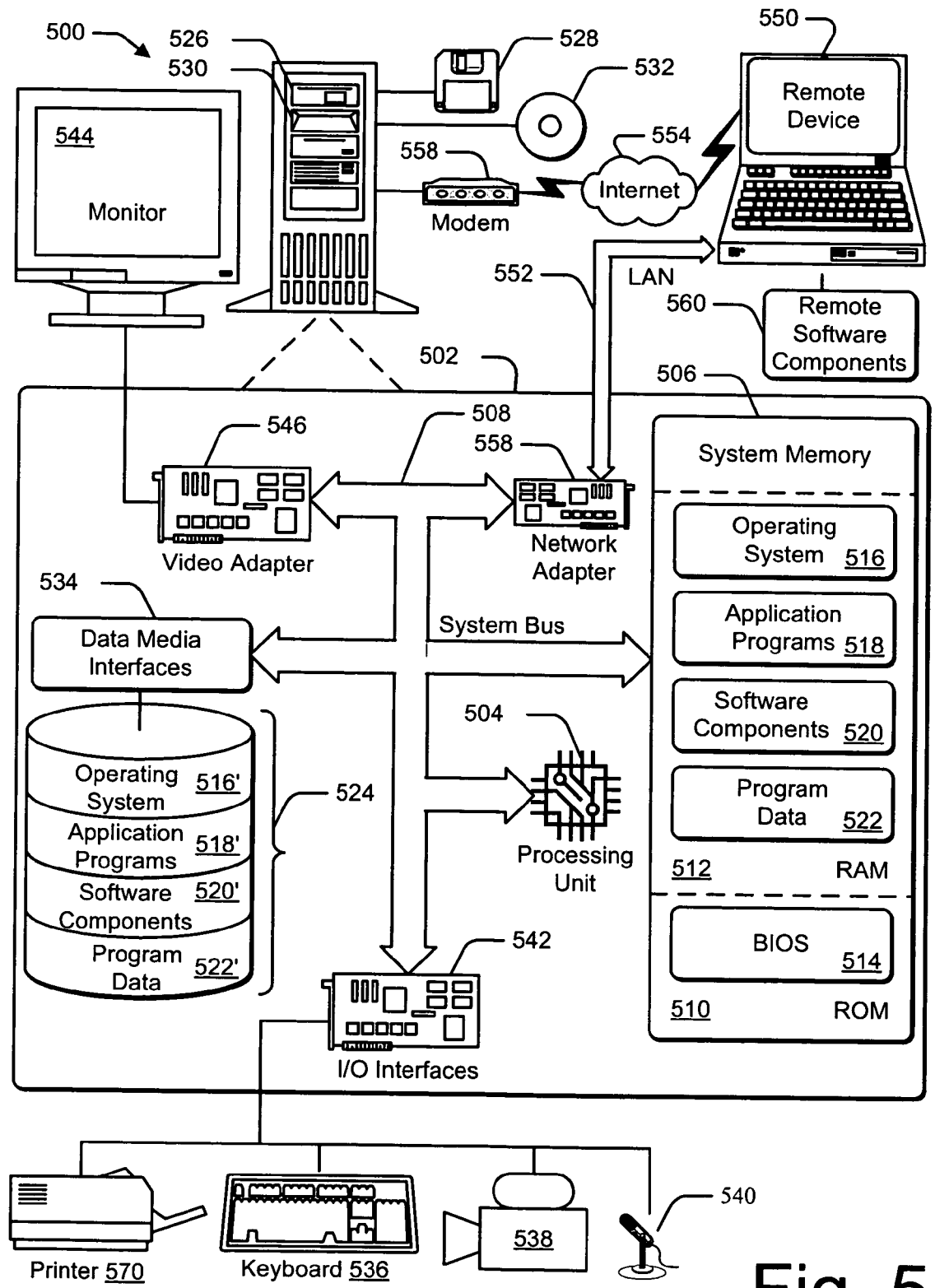
FIG. 5 is a schematic illustration of a computing system which may incorporate at least one air flow regulation devices according to an embodiment.

FIG. 5 is a schematic illustration of a computing system, according to an embodiment. The components shown in FIG. 5 are only examples, and are not intended to suggest any limitation as to the scope of the functionality of the invention; the invention is not necessarily dependent on the features shown in FIG. 5.

Generally, various different general purpose or special purpose computing system configurations can be used. Examples of well known computing systems, environments, and/or configurations that may be suitable for use with the invention comprise, but are not limited to, personal computers, server computers, hand-held or laptop devices, multiprocessor systems, microprocessor-based systems, set top boxes, programmable consumer electronics, network PCs, minicomputers, mainframe computers, distributed computing environments that comprise any of the above systems or devices, and the like.

With reference to FIG. 5, the components of computer 500 may comprise, but are not limited to, a processing unit 504, a system memory 506, and a system bus 508 that couples various system components including the system memory 506 to the processing unit 504. The system bus 508 may be any of several types of bus structures including a memory bus or memory controller, a peripheral bus, and a local bus using any of a variety of bus architectures. By way of example, and not limitation, such architectures comprise Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as the Mezzanine bus.

The system memory 506 comprises computer storage media in the form of volatile and/or nonvolatile memory such as read only memory (ROM) 510 and random access memory (RAM) 512. A basic input/output system 514 (BIOS), containing the basic routines that help to transfer information between elements within computer 500, such as during start-up, is typically stored in ROM 510. RAM 512 typically contains data and/or program modules that are immediately accessible to and/or presently being operated on by processing unit 504. By way of example, and not limitation, FIG. 5 illustrates operating system 516, application programs 518, other software components 520, and program data 522.

The computer 500 may comprise other removable/non-removable, volatile/nonvolatile computer storage media. By way of example only, the computer system of FIG. 5 may comprise a hard disk drive 524 that reads from or writes to non-removable, nonvolatile magnetic media, a magnetic disk drive 526 that reads from or writes to a removable, nonvolatile magnetic disk 528, and an optical disk drive 530 that reads from or writes to a removable, nonvolatile optical disk 532 such as a CD ROM or other optical media. Other removable/non-removable, volatile/nonvolatile computer storage media that can be used in the exemplary operating environment comprise, but are not limited to, magnetic tape cassettes, flash memory cards, digital versatile disks, digital video tape, solid state RAM, solid state ROM, and the like. The hard disk drive 524 is typically connected to the system bus 508 through a non-removable memory interface such as data media interface 534, and magnetic disk drive 526 and optical disk drive 530 are typically connected to the system bus 508 by a removable memory interface.

The drives and their associated computer storage media discussed above and illustrated in FIG. 5 provide storage of computer-readable instructions, data structures, program modules, and other data for computer 500. In FIG. 5, for example, hard disk drive 524 is illustrated as storing operating system 516', application programs 518', software components 520', and program data 522'. Note that these components can either be the same as or different from operating system 516, application programs 518, software components 520, and program data 522. Operating system 516, application programs 518, other program modules 520, and program data 522 are given different numbers here to illustrate that, at a minimum, they are different copies. A user may enter commands and information into the computer 500 through input devices such as a keyboard 536 and pointing device 538, commonly referred to as a mouse, trackball, or touch pad. Other input devices (not shown) may comprise a microphone 540, joystick, game pad, satellite dish, scanner, or the like. These and other input devices are often connected to the processing unit 504 through an input/output (I/O) interface 542 that is coupled to the system bus, but may be connected by other interface and bus structures, such as a parallel port, game port, or a universal serial bus (USB). A monitor 544 or other type of display device is also connected to the system bus 506 via an interface, such as a video adapter 546. In addition to the monitor 544, computers may also comprise other peripheral output devices (e.g., speakers) and at least one printer 570, which may be connected through the I/O interface 542.

The computer may operate in a networked environment using logical connections to at least one remote computer, such as a remote computing device 550. The remote computing device 550 may be a personal computer, a server, a router, a network PC, a peer device or other common network node, and typically comprises many or all of the elements described above relative to computer 500. The logical connections depicted in FIG. 5 comprise a local area network (LAN) 552 and a wide area network (WAN) 554. Although the WAN 554 shown in FIG. 5 is the Internet, the WAN 554 may also comprise other networks. Such networking environments are commonplace in offices, enterprise-wide computer networks, intranets, and the like.

When used in a LAN networking environment, the computer 500 is connected to the LAN 552 through a network interface or adapter 556. When used in a WAN networking environment, the computer 500 typically comprises a modem 558 or other means for establishing communications over the Internet 554. The modem 558, which may be internal or external, may be connected to the system bus 506 via the I/O interface 542, or other appropriate mechanism. In a networked environment, program modules depicted relative to the computer 500, or portions thereof, may be stored in the remote computing device 550. By way of example, and not limitation, FIG. 5 illustrates remote application programs 560 as residing on remote computing device 550. It will be appreciated that the network connections shown are exemplary and other means of establishing a communications link between the computers may be used.

In some embodiments air flow regulation devices as described herein may be used on other board types such as, e.g., input/output (I/O) boards like PCI boards, voltage regulator modules (VRM) boards, motherboards, and the like.

Reference in the specification to "one embodiment" or "an embodiment" means that a particular feature, structure, or characteristic described in connection with the embodiment is comprised in at least an implementation. The appearances of the phrase "in one embodiment" in various places in the specification are not necessarily all referring to the same embodiment.

Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. An airflow regulation device, comprising:
   at least one base member configured to couple to a connector on a circuit board;
   a first segment connected to the at least one base member and extending a first height from the at least one base member; and
   a second segment removably connected to the first segment and extending a second height from the at least one base member, wherein the second height is different than the first height.

2. The airflow regulation device of claim 1, wherein the at least one base member is configured to couple to a memory socket on a circuit board.

3. The airflow regulation device of claim 1, wherein the second segment comprises at least one tab adapted to connect to a memory socket on a circuit board.

4. The airflow regulation device of claim 1, wherein the second segment is connected to the first segment by at least one breakable tab.

5. The airflow regulation device of claim 1, wherein the second segment has a height that corresponds to a height of a small outline memory module.

6. The airflow regulation device of claim 5, wherein the first segment fits above a small outline memory module when the second segment is removed.

7. A circuit board assembly comprising:
   a circuit board;
   at least one airflow regulation device connected to the circuit board, wherein the airflow regulation device comprises:
      at least one base member configured to couple to a connector on a circuit board;
      a first segment connected to the at least one base member and extending a first height from the at least one base member; and
      a second segment removably connected to the first segment and extending a second height from the at least one base member, wherein the second height is different than the first height.

8. The circuit board assembly of claim 7, wherein the at least one base member is configured to mate with a memory socket on the circuit board.

9. The circuit board assembly of claim 7, wherein the second segment comprises at least one tab adapted to connect to a memory socket on a circuit board.

10. The circuit board assembly of claim 7, wherein the second segment is connected to the first segment by at least one breakable tab.

11. The circuit board assembly of claim 7, wherein the second segment has a height that corresponds to a height of a small outline memory module.

12. The circuit board assembly of claim 11, wherein the first segment fits above a small outline memory module when the second segment is removed.

13. A computer system, comprising:
   a motherboard comprising at least one integrated circuit and at least one airflow regulation device connected to the motherboard, wherein the airflow regulation device comprises:
      at least one base member configured to couple to a connector on the motherboard;
      a first segment connected to the at least one base member and extending a first height from the at least one base member; and
      a second segment removably connected to the first segment and extending a second height from the at least one base member, wherein the second height is different than the first height.

14. The computer system of claim 13, wherein the at least one base member is configured to mate with a memory socket on the motherboard.

15. The computer system of claim 13, wherein the second segment comprises at least one tab adapted to connect to a memory socket on the motherboard.

16. The computer system of claim 13, wherein the second segment is connected to the first segment by at least one breakable tab.

17. The computer system of claim 13, wherein the second segment has a height that corresponds to a height of a small outline memory module.

18. The computer system of claim 17, wherein the first segment fits above a small outline memory module when the second segment is removed.

* * * * *

UNITED STATES PATENT AND TRADEMARK OFFICE
CERTIFICATE OF CORRECTION

| | |
|---|---|
| PATENT NO. | : 7,379,297 B2 |
| APPLICATION NO. | : 11/586300 |
| DATED | : May 27, 2008 |
| INVENTOR(S) | : Eric C. Peterson et al. |

It is certified that error appears in the above-identified patent and that said Letters Patent is hereby corrected as shown below:

On the Title page, in field (56), under "U.S. Patent Documents", in column 2, line 1, after "5,034,853 A" insert -- * --.

On the Title page, in field (56), under "U.S. Patent Documents", in column 2, line 2, after "6,118,667 A" insert -- * --.

On the Title page, in field (56), under "U.S. Patent Documents", in column 2, line 3, after "6,130,820 A" insert -- * --.

On the Title page, in field (56), under "U.S. Patent Documents", in column 2, line 4, after "6,193,529 B1" insert -- * --.

On the Title page, in field (56), under "U.S. Patent Documents", in column 2, line 5, after "6,755,672 B2" insert -- * --.

On the Title page, in field (56), under "U.S. Patent Documents", in column 2, line 6, after "6,971,884 B2" insert -- * --.

On the Title page, in field (56), under "U.S. Patent Documents", in column 2, line 7, after "7,061,760 B2" insert -- * --.

On the Title page, in field (56), under "U.S. Patent Documents", in column 2, line 8, after "7,092,252 B2" insert -- * --.

On the Title page, in field (56), under "U.S. Patent Documents", in column 2, line 9, after "7,106,595 B2" insert -- * --.

UNITED STATES PATENT AND TRADEMARK OFFICE
CERTIFICATE OF CORRECTION

| | |
|---|---|
| PATENT NO. | : 7,379,297 B2 |
| APPLICATION NO. | : 11/586300 |
| DATED | : May 27, 2008 |
| INVENTOR(S) | : Eric C. Peterson et al. |

It is certified that error appears in the above-identified patent and that said Letters Patent is hereby corrected as shown below:

On the Title page, in field (56), under "U.S. Patent Documents", in column 2, line 10, after "2004/0005808 A1" insert -- * --.

Signed and Sealed this

Twelfth Day of August, 2008

JON W. DUDAS
*Director of the United States Patent and Trademark Office*